United States Patent
Bresniker et al.

(10) Patent No.: US 7,263,620 B2
(45) Date of Patent: Aug. 28, 2007

(54) SYSTEM AND METHOD FOR GRACEFUL SHUTDOWN OF HOST PROCESSOR CARDS IN A SERVER SYSTEM

(75) Inventors: Kirk Bresniker, Roseville, CA (US); James K. Koch, Rocklin, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1015 days.

(21) Appl. No.: 09/923,976

(22) Filed: Aug. 7, 2001

(65) Prior Publication Data

US 2003/0033546 A1    Feb. 13, 2003

(51) Int. Cl.
G06F 9/00    (2006.01)
G06F 9/24    (2006.01)
G06F 15/177    (2006.01)

(52) U.S. Cl. .................. 713/300; 718/100; 340/540; 340/693.1; 340/693.3; 340/7.36; 713/1

(58) Field of Classification Search ............ 713/310, 713/300, 502, 1; 307/140, 147, 64; 320/119; 363/78; 714/12, 4, 24; 718/100; 709/223, 709/224; 340/693.3, 7.36
See application file for complete search history.

(56) References Cited

U.S. PATENT DOCUMENTS

| | | | |
|---|---|---|---|
| 5,295,258 A * | 3/1994 | Jewett et al. ................. 714/12 |
| 5,530,302 A * | 6/1996 | Hamre et al. ................ 307/147 |
| 5,544,006 A | 8/1996 | Radloff et al. |
| 5,546,590 A * | 8/1996 | Pierce ........................ 713/323 |
| 5,594,893 A * | 1/1997 | Byers et al. ................. 713/502 |
| 5,758,171 A * | 5/1998 | Ramamurthy et al. ...... 713/300 |
| 5,781,770 A * | 7/1998 | Byers et al. ................. 713/502 |
| 5,809,262 A | 9/1998 | Potter |
| 5,847,950 A * | 12/1998 | Bhagwat ....................... 363/78 |
| 5,923,099 A * | 7/1999 | Bilir ............................ 307/64 |
| 5,989,043 A * | 11/1999 | Han et al. .................... 439/157 |
| 6,023,148 A * | 2/2000 | Pignolet ...................... 320/119 |
| 6,046,912 A | 4/2000 | Leman |
| 6,058,011 A | 5/2000 | Hardt et al. |
| 6,094,575 A * | 7/2000 | Anderson et al. ......... 455/422.1 |
| 6,105,140 A * | 8/2000 | Crisan ......................... 713/310 |
| 6,112,271 A | 8/2000 | Lanus et al. |
| 6,129,591 A | 10/2000 | Czeschka |
| 6,138,247 A | 10/2000 | McKay et al. |

(Continued)

OTHER PUBLICATIONS

A copy of the Search Report results from Great Britain Application No. 0217601.4; 2 pg.

(Continued)

*Primary Examiner*—Bunjob Jaroenchonwanit
*Assistant Examiner*—Dustin Nguyen

(57) ABSTRACT

A host processor card configured to be fitted into a server system includes a processor, and a memory coupled to the processor for storing an operating system. A power control line controls the power state of the host processor card. A graceful shutdown circuit is coupled to the processor and the power control line. The processor is configured to provide a graceful shutdown signal to the graceful shutdown circuit. The graceful shutdown circuit is configured to allow a graceful shutdown of the host processor card when the power control line indicates that the host processor card is to be powered down if the processor has provided the graceful shutdown signal.

15 Claims, 7 Drawing Sheets

U.S. PATENT DOCUMENTS

| | | | |
|---|---|---|---|
| 6,161,197 A | 12/2000 | Lanus et al. | |
| 6,162,073 A | 12/2000 | Haq et al. | |
| 6,166,902 A | 12/2000 | Liu et al. | |
| 6,185,093 B1 | 2/2001 | Moss | |
| 6,185,110 B1 | 2/2001 | Liu | |
| 6,195,262 B1 | 2/2001 | Bodette et al. | |
| 6,198,633 B1 | 3/2001 | Lehman et al. | |
| 6,209,051 B1 | 3/2001 | Hill et al. | |
| 6,230,181 B1 * | 5/2001 | Mitchell et al. | 718/100 |
| 6,237,048 B1 | 5/2001 | Allen et al. | |
| 6,351,083 B1 * | 2/2002 | Ten Holter | 315/315 |
| 6,438,684 B1 * | 8/2002 | Mitchell et al. | 713/1 |
| 6,445,086 B1 * | 9/2002 | Houston | 307/24 |
| 6,528,904 B1 * | 3/2003 | Wong | 307/140 |
| 6,550,017 B1 * | 4/2003 | Moiin et al. | 714/4 |
| 6,598,175 B1 * | 7/2003 | Berg et al. | 714/24 |
| 6,957,363 B2 * | 10/2005 | Spiegel | 714/24 |
| 7,099,934 B1 * | 8/2006 | Ewing et al. | 709/223 |
| 7,190,267 B2 * | 3/2007 | Vaserfirer | 340/540 |
| 2002/0069371 A1 * | 6/2002 | Teeling | 713/300 |
| 2002/0138772 A1 * | 9/2002 | Crawford et al. | 713/300 |

OTHER PUBLICATIONS

PCI Industrial Computers Manufacturers Group (PCIMG); "CompactPCI Specification Short Form"; Sep. 2, 1997; pp. 1-7.

Ziatech; www.ziatech.com (homepage); Ziatech, an Intel company, Leaders in CompactPCI Innovation; 2001.

* cited by examiner

SYSTEM AND METHOD FOR GRACEFUL SHUTDOWN OF HOST PROCESSOR CARDS IN A SERVER SYSTEM

THE FIELD OF THE INVENTION

The present invention relates to server systems. More particularly, the invention relates to a host processor card having a graceful shutdown capability.

BACKGROUND OF THE INVENTION

Compact peripheral component interconnect (cPCI) is a standardized industrial form-factor implementation of the PCI Local bus I/O standard. As a physical standard, cPCI implements features that are designed to allow for the insertion and removal of I/O modules into a live chassis, for example blind mate connectors and staged length power and signal pins. In addition, as an electrical and protocol standard, there are features in cPCI that allow for inserted I/O modules to be recognized and configured, or removed modules to be de-configured by the host of the I/O bus and the software running on it. Pending removal of a peripheral I/O card is indicated by actuating an extractor handle, which has an integral switch to generate an electrical signal to the I/O bus host. Cards are energized after insertion or de-energized prior to removal by a hot swap controller, which is typically integrated into the host processor card.

Existing implementations are satisfactory for insertion and removal of I/O modules from a bus hosted in a chassis by a single host processor card that includes a hot swap controller. The I/O modules can tolerate immediate shutdown, and shutdown of the single host implies complete shutdown of the unit, and as such, implies graceful operating system shutdown.

While the above-described hot swap mechanisms are adequate when I/O modules are inserted or removed, it proves to be inadequate when host processor cards are swapped out. This is due to the fact that the host processor cards typically run operating system and application code that cannot tolerate the immediate power shutdown associated with the removal process, due to the caching of storage transactions in volatile memory. Also, the hot swap controller is typically integrated into a host processor card, which means that the host processor card cannot typically turn itself on or off, and which also means that if the host processor card needs to be replaced, all other modules will be affected. This problem is greatly exacerbated in a system where there are no I/O modules, but primarily only host processor cards connected via a switched network fabric. In a system with multiple independent hosts per chassis connected through a switched network fabric, the existing technology fails to guarantee that host processor cards with operating systems and applications will be gracefully shutdown.

It would be desirable to provide a controlled mechanism by which a host processor card can participate in the standard cPCI hot swap protocol, and still allow for a graceful shutdown required for data integrity. It would be desirable to provide a consistent hot swap system for I/O modules and host processor cards in a system with multiple hosts, which guarantees graceful shutdown of operating systems and applications with facilities to override if necessary.

SUMMARY OF THE INVENTION

One form of the present invention provides a host processor card configured to be fitted into a server system. The host processor card includes a processor, and a memory coupled to the processor for storing an operating system. A power control line controls the power state of the host processor card. A graceful shutdown circuit is coupled to the processor and the power control line. The processor is configured to provide a graceful shutdown signal to the graceful shutdown circuit. The graceful shutdown circuit is configured to allow a graceful shutdown of the host processor card when the power control line indicates that the host processor card is to be powered down if the processor has provided the graceful shutdown signal.

DESCRIPTION OF THE PREFERRED EMBODIMENTS

In the following detailed description of the preferred embodiments, reference is made to the accompanying drawings that form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

I. Server System

Figure 1:
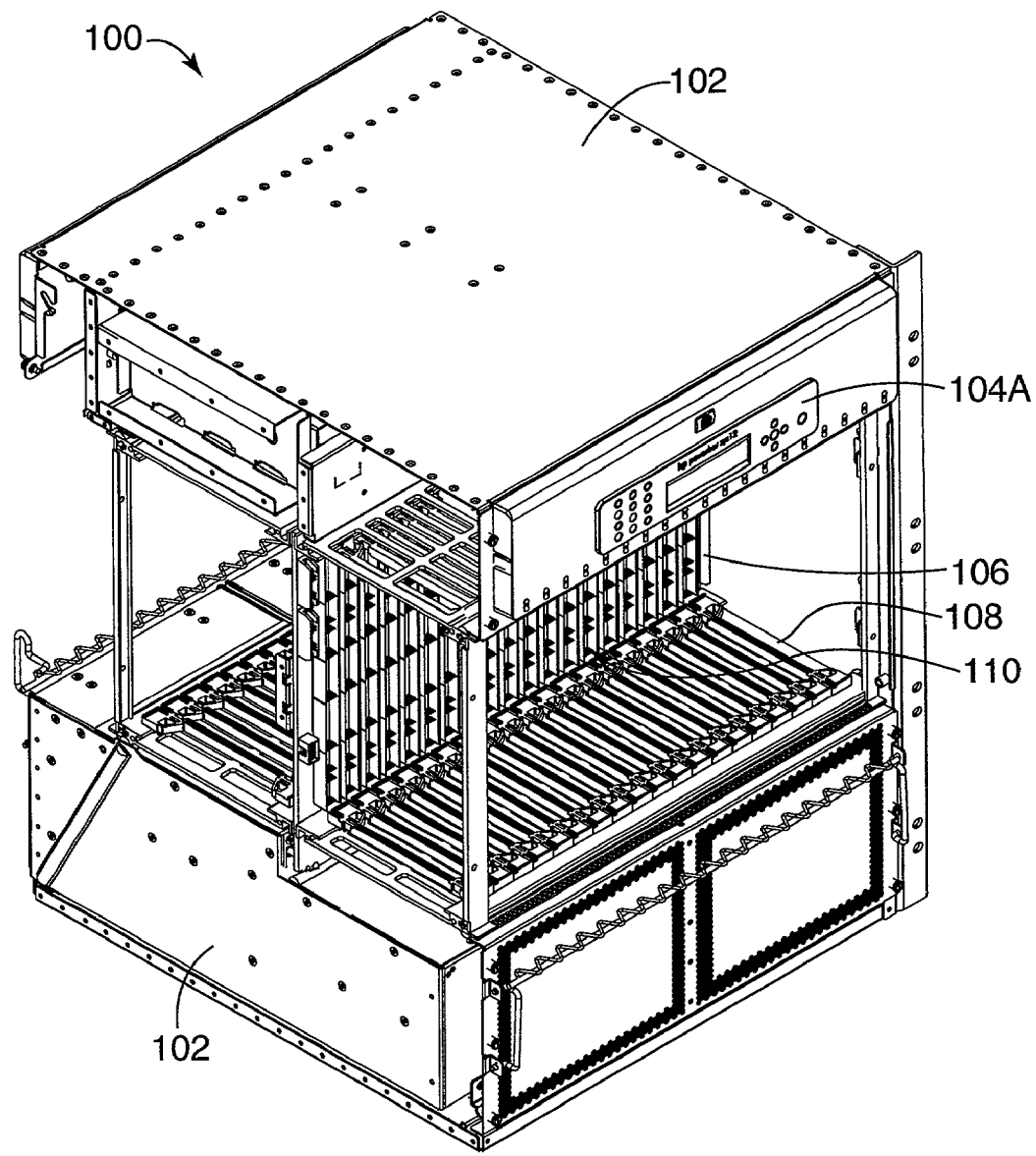
FIG. 1 is a front perspective view illustrating a server system according to one embodiment of the present invention.
Figure 2:
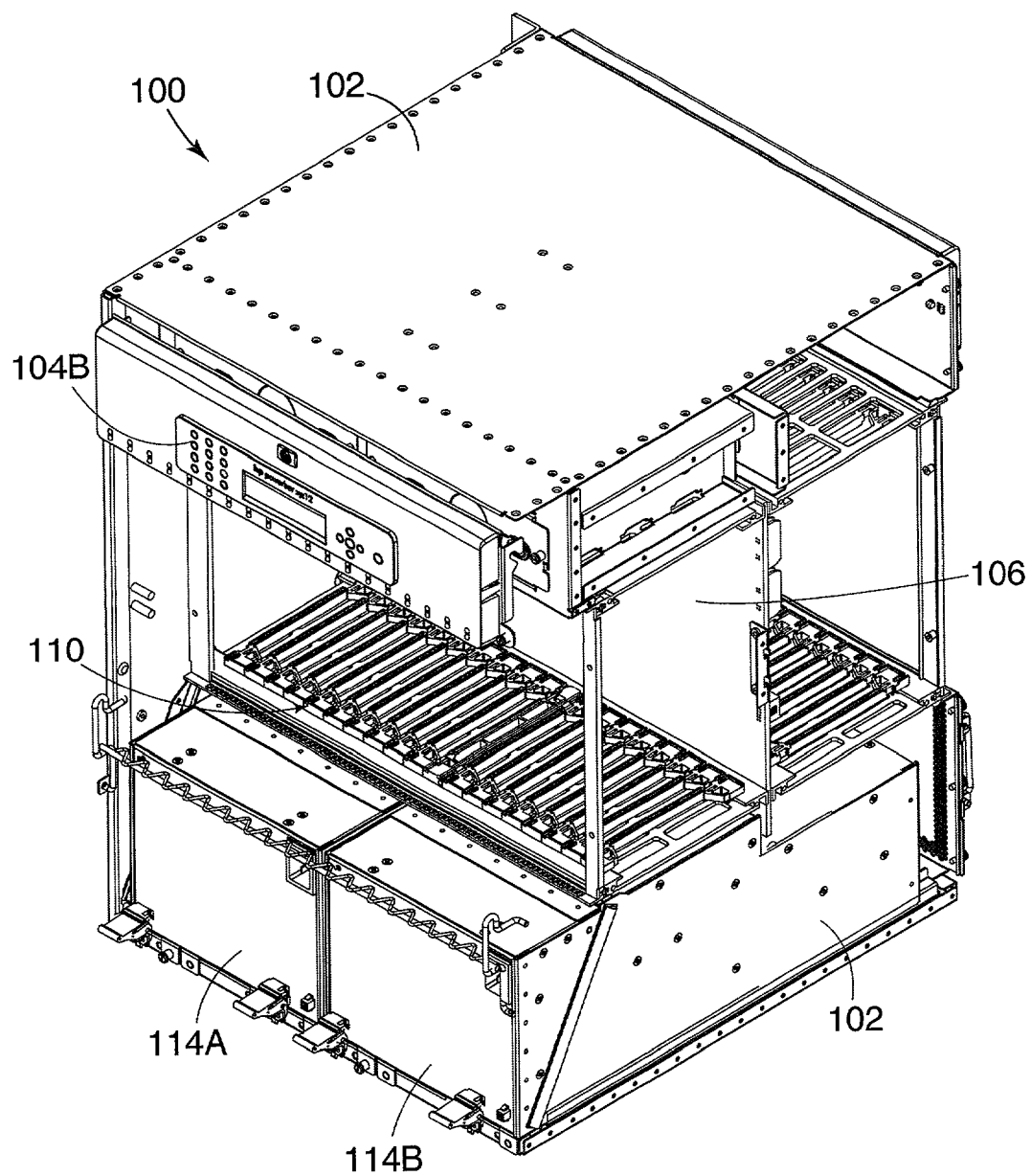
FIG. 2 is a rear perspective view illustrating the server system shown in FIG. 1.

FIG. 1 is a front perspective view illustrating a server system 100 according to one embodiment of the present invention. FIG. 2 is a rear perspective view illustrating server system 100. Server system 100 includes panels 102, liquid crystal display (LCD) panels 104A and 104B (collectively referred to as LCD panels 104), backplane 106, chassis 108, and dual redundant power supply units 114A and 114B (collectively referred to as power supply units 114). Panels 102 are attached to chassis 108, and provide protection for the internal components of server system 100. Backplane 106 is positioned near the center of server system 100. Backplane 106 is also referred to as midplane 106. LCD panels 104A and 104B are substantially identical, except for their placement on server system 100. LCD panel 104A is positioned on a front side of server system 100, and LCD panel 104B is positioned on a back side of server system 100.

Power supply units 114 are positioned at the bottom of server system 100 and extend from a back side of server system 100 to a front side of server system 100. Power supply units 114 each include an associated cooling fan 304 (shown in block form in FIG. 3). In one form of the invention, additional cooling fans 304 are positioned behind LCD panel 104B. In one embodiment, 4 chassis cooling fans 304 are used in server system 100. In an alternative embodiment, 6 chassis cooling fans 304 are used. Other numbers and placement of cooling fans 304 may be used. In one form of the invention, cooling fans 304 form an N+1 redundant cooling system, where "N" represents the total number of necessary fans 304, and "1" represents the number of redundant fans 304.

In one embodiment, server system 100 supports the Compact Peripheral Component Interconnect (cPCI) form factor of printed circuit assemblies (PCAs). Server system 100 includes a plurality of cPCI slots 110 for receiving cards/modules 300 (shown in block form in FIG. 3). In one embodiment, system 100 includes ten slots 110 on each side of backplane 106 (referred to as the 10 slot configuration). In an alternative embodiment, system 100 includes nineteen slots 110 on each side of backplane 106 (referred to as the 19 slot configuration). Additional alternative embodiments use other slot configurations.

Figure 3:
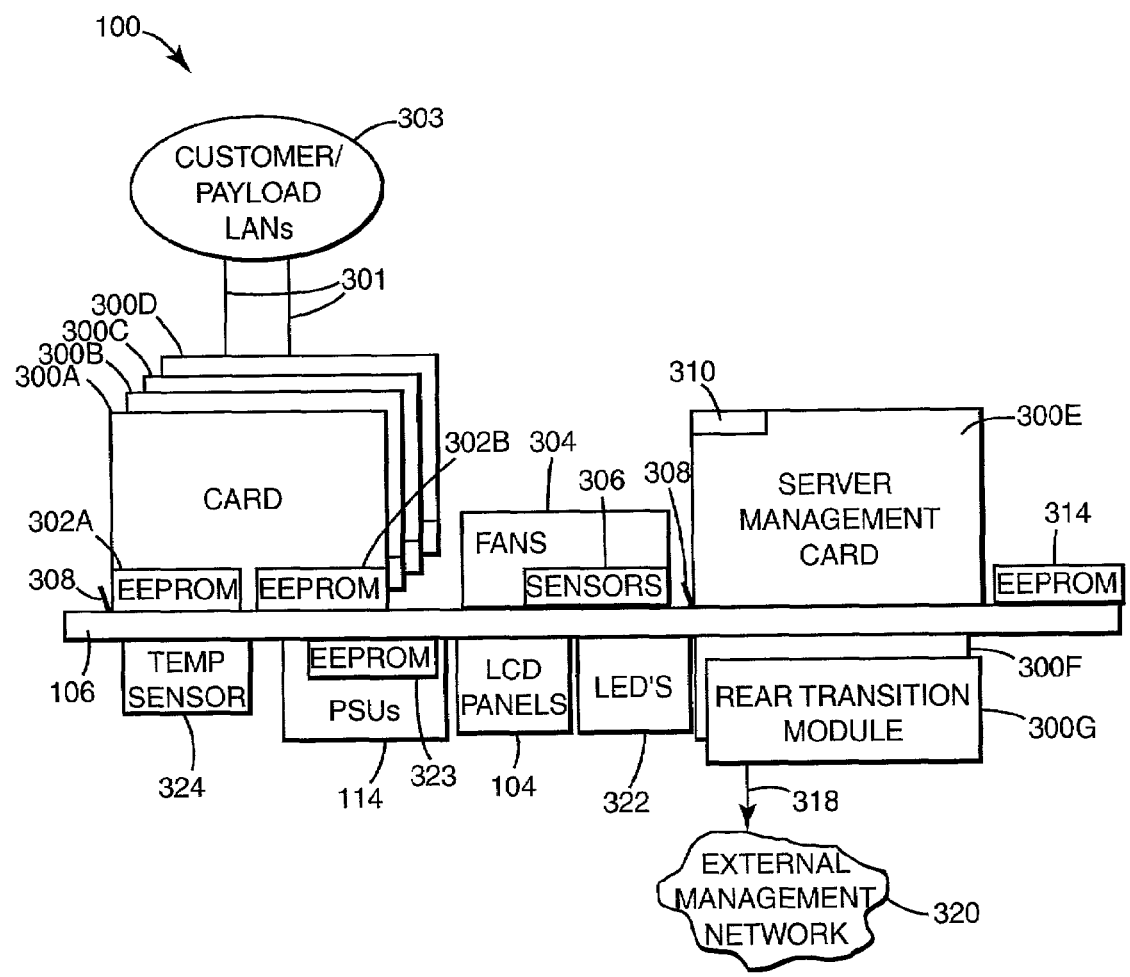
FIG. 3 is a block diagram illustrating major components of a server system according to one embodiment of the present invention.

FIG. 3 is a block diagram illustrating major components of server system 100. Server system 100 includes backplane 106, a plurality of cards/modules 300A-300G (collectively referred to as cards 300), fans 304, electrically erasable programmable read only memory (EEPROM) 314, LEDs 322, LCD panels 104, power supply units (PSUs) 114, and temperature sensor 324. Cards 300 are inserted in slots 110 (shown in FIGS. 1 and 2) in system 100. In one form of the invention, cards 300 may occupy more than one slot 110. In one embodiment, cards 300 include host processor cards 300A, hard disk cards 300B, managed Ethernet switch cards 300C and 300D, a server management card (SMC) 300E, and 2 redundant SMC local area network (LAN) rear transition modules (RTMs) 300F and 300G. In one embodiment, there is one managed Ethernet switch card 300C fitted in the 10 slot chassis embodiment, and up to two managed Ethernet switch cards 300C and 300D fitted in the 19 slot chassis embodiment. In one form of the invention, managed Ethernet switch cards 300C and 300D are "Procurve" managed Ethernet switch cards.

In one embodiment, two types of host processor cards 300A maybe used in server system 100—PA-RISC host processor cards and IA32 host processor cards. Multiple host processor cards 300A and hard disk cards 300B are used in embodiments of server system 100, but are each represented by a single card in FIG. 3 to simply the figure. In one form of the invention, up to 8 host processor cards 300A are used in the 10 slot configuration, and up to 16 host processor cards 300A are used in the 19 slot configuration In one embodiment, each of cards 300 can be hot swapped.

In one embodiment, cards 300 each include a pair of EEPROMs 302A and 302B, which are discussed below. Power supply units 114 each include an EEPROM 323 for storing power supply identification and status information. Fans 304 include associated sensors 306 for monitoring the speed of the fans 304. In one embodiment, LEDs 322 include eight status LEDs, six LAN LEDs to indicate the speed and link status of LAN links 318, a blue hot swap status LED to indicate the ability to hot-swap SMC 300E, a power-on indicator LED, and three fan control indicator LEDs.

The operational health of cards 300 and system 100 are monitored by SMC 300E to ensure the reliable operation of the system 100. SMC 300E includes serial ports 310 (discussed below), and an extraction lever 308 with an associated switch. In one embodiment, all cards 300 include an extraction lever 308 with an associated switch.

In one embodiment, SMC 300E is the size of a typical compact PCI (cPCI) card, and supports PA-RISC and the IA32 host processor cards 300A. SMC 300E electrically connects to other components in system 100, including cards 300, temperature sensor 324, power supply units 114, fans 304, EEPROM 314, LCD panels 104, LEDs 322, and SMC rear transition modules 300F and 300G via backplane 106. In most cases, the connections are via $I^2C$ buses 554 (shown in FIG. 5), as described in further detail below. The $I^2C$ buses 554 allow bi-directional communication so that status information can be sent to SMC 300E and configuration information sent from SMC 300E. In one embodiment, SMC 300E uses $I^2C$ buses 554 to obtain environmental information from power supply units 114, host processor cards 300A, and other cards 300 fitted into system 100.

SMC 300E also includes a LAN switch 532 (shown in FIG. 5) to connect console management LAN signals from the host processor cards 300A to an external management network (also referred to as management LAN) 320 via one of the two SMC rear transition modules 300F and 300G. In one embodiment, the two SMC rear transition modules 300F and 300G each provide external 10/100Base-T LAN links 318 for connectivity to management LAN 320. In one embodiment, SMC rear transition modules 300F and 300G are fibre-channel, port-bypass cards Managed Ethernet switch cards 300C and 300D are connected to host processor cards 300A through backplane 106, and include external 10/100/1000Base-T LAN links 301 for connecting host processor cards to external customer or payload LANs 303. Managed Ethernet switch cards 300C and 300D are fully managed LAN switches.

II. LCD Panel

Figure 4:
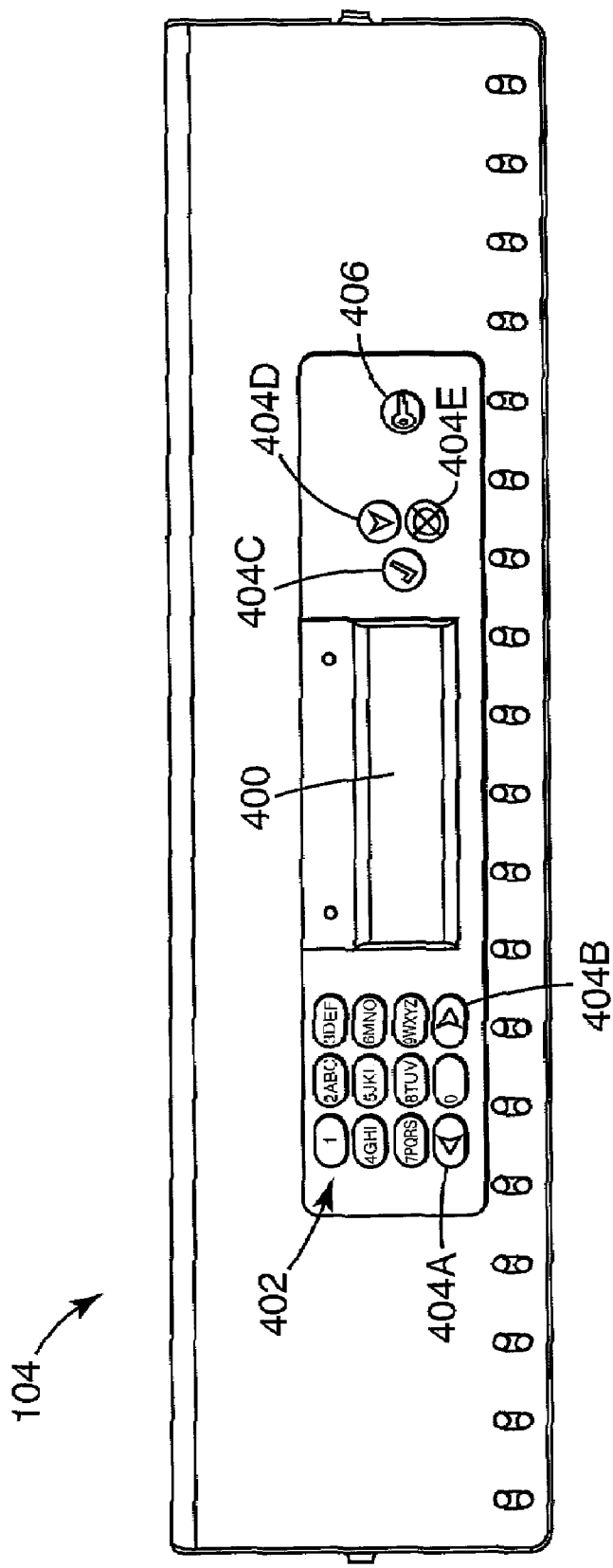
FIG. 4 is a front view of one of LCD panels used by a server system according to one embodiment of the present invention.

FIG. 4 is a front view of one of LCD panels 104. In one form of the invention, each LCD panel 104 includes a 2×20 LCD display 400, 10 alphanumeric keys 402, 5 menu navigation/activation keys 404A-404E (collectively referred to as navigation keys 404), and a lockout key 406 with associated LED (not shown) that lights lockout key 406. If a user presses a key 402, 404, or 406, an alert signal is generated and SMC 300E polls the LCD panels 104A and 104B to determine which LCD panel was used, and the key that was pressed.

Alphanumeric keys 402 allow a user to enter alphanumeric strings that are sent to SMC 300E. Navigation keys 404 allow a user to navigate through menus displayed on LCD display 400, and select desired menu items. Navigation keys 404A and 404B are used to move left and right, respectively, within the alphanumeric strings. Navigation key 404C is an "OK/Enter" key. Navigation key 404D is used to move down. Navigation key 404E is a "Cancel" key.

LCD panels 104 provide access to a test shell (discussed below) that provides system information and allows configuration of system 100. As discussed below, other methods of access to the test shell are also provided by system 100. To avoid contention problems between the two LCD panels 104, and the other methods of access to the test shell, a lockout key 406 is provided on LCD panels 104. A user can press lockout key 406 to gain or release control of the test shell. In one embodiment, lockout key 406 includes an associated LED to light lockout key 406 and indicate a current lockout status.

In one embodiment, LCD panels 104 also provide additional information to that displayed by LEDs 322 during start-up. If errors are encountered during the start-up sequence, LCD panels 104 provide more information about the error without the operator having to attach a terminal to one of the SMC serial ports 310.

III. Server Management Card (SMC)

A. SMC Overview

Figure 5:
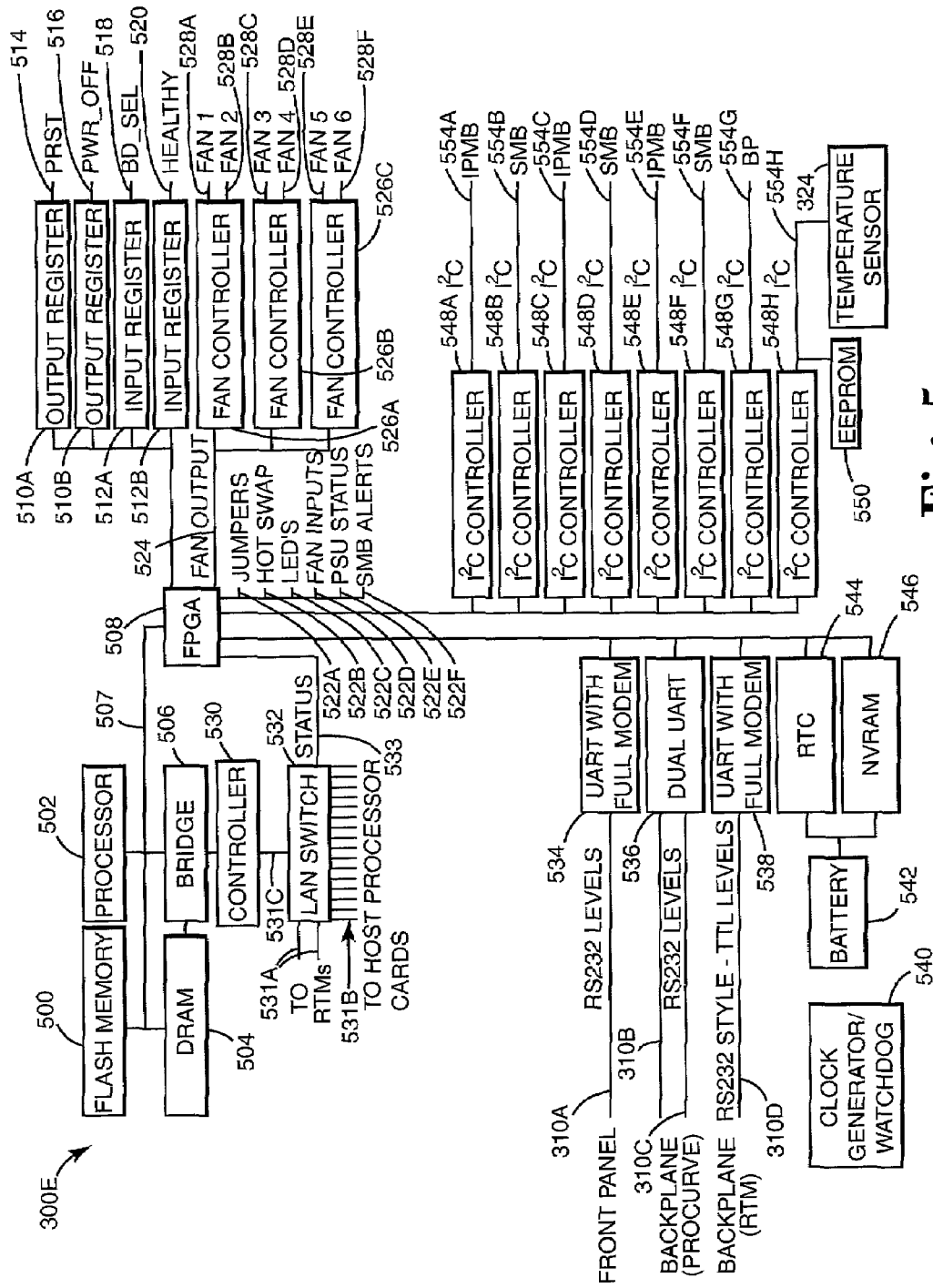
FIG. 5 is an electrical block diagram illustrating major components of a server management card (SMC) according to one embodiment of the present invention.

FIG. 5 is an electrical block diagram illustrating major components of server management card (SMC) 300E. SMC 300E includes flash memory 500, processor 502, dynamic random access memory (DRAM) 504, PCI bridge 506, field programmable gate array (FPGA) 508, output registers 510A and 510B, input registers 512A and 512B, fan controllers 526A-526C (collectively referred to as fan controllers 526), network controller 530, LAN switch 532, universal asynchronous receiver transmitter (UART) with modem 534, dual UART 536, UART with modem 538, clock generator/watchdog 540, battery 542, real time clock (RTC) 544, non-volatile random access memory (NVRAM) 546, $I^2C$ controllers 548A-548H (collectively referred to as $I^2C$ controllers 548), EEPROM 550, and temperature sensor 324. In one embodiment, components of SMC 300E are connected together via PCI buses 507. In one form of the invention, PCI buses 507 are not routed between slots 110. Switched LAN signals through LAN switch 532 are routed between slots 110.

Functions of SMC 300E include supervising the operation of other components within system 100 (e.g. fan speed, temperature, card present) and reporting their health to a central location (e.g., external management network 320), reporting any failures to a central location (e.g., external management network 320), providing a LAN switch 532 to connect console management LAN signals from the SMC 300E and host processor cards 300A to an external management network 320, and providing an initial boot configuration for the system 100.

B. SMC Processor and Memory

SMC 300E includes chassis management processor 502. In one embodiment, chassis management processor 502, also referred to as SMC processor 502, is a StrongARM SA-110 processor with supporting buffer. In one embodiment, SMC 300E uses a Linux operating system. SMC 300E also runs server management application (SMA) software/firmware. In one embodiment, the operating system and SMA are stored in flash memory 500. In one form of the invention, all information needed to power-up SMC 300E, and for SMC 300E to become operational, are stored in flash memory 500. In one embodiment, flash memory 500 includes 4 to 16 Mbytes of storage space to allow SMC 300E to boot-up as a stand-alone card (i.e., no network connection needed).

SMC 300E also includes DRAM 504. In one embodiment, DRAM 504 includes 32, 64 or 128 Mbytes of storage space. In one form of the invention, a hardware fitted table is stored in DRAM 504. The hardware fitted table includes information representing the physical configuration of system 100. The hardware fitted table changes if there is a physical change to system 100, such as by a hardware device being added to or removed from system 100. The hardware fitted table includes hardware type information (e.g., whether a device is an IA32/PA-RISC/Disk Carrier/RTM (i.e., rear transition module)/PSU/LCD panel/Modem/Unknown device, etc.), hardware revision and serial number, status information, configuration information, and hot-swap status information.

Processor 502 is coupled to FPGA 508. FPGA 508 includes 6 sets of input/output lines 522A-522F. Lines 522A are connected to jumpers for configuring SMC 300E. Lines 522B are hot swap lines for monitoring the hot swap status of cards 300. In one embodiment, hot swap lines 522B include 18 hot swap status input lines, which allow SMC 300E to determine the hot swap status of the host processor cards 300A, hard disk cards 300B, managed Ethernet switch cards 300C and 300D, SMC rear transition modules 300F and 300G, and power supply units 114. Lines 522C are LED lines that are coupled to LEDs 322. Lines 522D are fan input lines that are coupled to fan sensors 306 for monitoring the speed of fans 304. Lines 522E are power supply status lines that are coupled to power supply units 114 for determining whether both, or only one power supply unit 114 is present. Lines 522F are SMB alert lines for communicating alert signals related to SMB $I^2C$ buses 554B, 554D, and 554F.

C. Clock, Battery & NVRAM

SMC 300E includes a real time clock (RTC) 544 and an associated battery 542 to preserve the clock. Real time clock 544 provides the correct time of day. SMC 300E also includes NVRAM 546 for storing clock information. In one embodiment, NVRAM 546 uses the same battery as real time clock 544.

D. LAN Switch

SMC 300E sends and receives management LAN communications through PCI bridge 506 and controller 530 to LAN switch 532. In one embodiment, LAN switch 532 is an unmanaged LAN switch including 19 ports, with two ports connected to SMC rear transition modules 300F and 300G (shown in FIG. 3) via links 531A for communications with external management network 320 (shown in FIG. 3), 16 ports for connecting to the management LAN connections of up to 16 host processor cards 300A via links 531B through backplane 106, and one port for connecting to the SMC's LAN port (i.e., output of controller 530) via links 531C. SMC 300E provides management support for console LAN management signals sent and received through LAN switch 532. SMC 300E provides control of management LAN signals of host processor cards 300A, managed Ethernet switches 300C and 300D, SMC processor 502, and SMC rear transition modules 300F and 300G. SMC 300E monitors the status of the management LAN connections of up to 16 host processor cards 300A to LAN switch 532, and reports an alarm event if any of the connections are lost. FPGA 508 and LAN switch 532 are coupled together via an RS-232 link 533 for the exchange of control and status information.

E. $I^2C$ Buses

Server system 100 includes eight $I^2C$ buses 554A-554H (collectively referred to as $I^2C$ buses 554) to allow communication with components within system 100. $I^2C$ buses 554 are coupled to FPGA 508 via $I^2C$ controllers 548. In one embodiment, the $I^2C$ buses 554 include 3 intelligent platform management bus (IPMB) buses 554A, 554C, and 554E, 3 system management bus (SMB) buses 554B, 554D, and 554F, a backplane ID bus (BP) 554G, and an $I^2C$ bus 554H for accessing SMC EEPROM 550 and chassis temperature sensor 324. A different number and configuration of $I^2C$ buses 554 may be used depending upon the desired implementation. SMC 300E maintains a system event log (SEL) within non-volatile flash memory 500 for storing information gathered over I²C buses 554.

The IPMB I²C buses 554A, 554C, and 554E implement the intelligent platform management interface (IPMI) specification. The IPMI specification is a standard defining an abstracted interface to platform management hardware. IPMI is layered over the standard I²C protocol. SMC 300E uses one or more of the IPMB I²C buses 554A, 554C, and 554E to retrieve static data from each of the host processor cards 300A and hard disk cards 300B. The static data includes identification information for identifying each of the cards 300A and 300B. Each slot 110 in system 100 can be individually addressed to retrieve the static configuration data for the card 300 in that slot 110. In one embodiment, the host processor cards 300A and hard disk cards 300B each include an EEPROM 302A (shown in FIG. 3) that stores the static identification information retrieved over IPMB I²C buses 554A, 554C, and 554E. In one embodiment, each EEPROM 302A contains the type of card, the name of the card, the hardware revision of the card, the card's serial number and card manufacturing information.

SMC 300E also uses one or more of the IPMB I²C buses 554A, 554C, and 554E, to retrieve dynamic environmental information from each of the host processor cards 300A and hard disk cards 300B. In one embodiment, this dynamic information is held in a second EEPROM 302B (shown in FIG. 3) on each of the cards 300A and 300B. In one form of the invention, the dynamic board data includes card temperature and voltage measurements. In one embodiment, SMC 300E can write information to the EEPROMs 302A and 302B on cards 300.

The three SMB I²C buses 554B, 554D, and 554F also implement the IPMI specification. The three SMB I²C buses 554B, 554D, and 554F, are coupled to LEDs 322, the two LCD panels 104, the dual redundant power supply units 114, and some of the host processor cards 300A. SMC 300E uses one or more of the SMB I²C buses 554B, 554D, and 554F, to provide console communications via the LCD panels 104. In order for the keypad key-presses on the LCD panels 104 to be communicated back to SMC 300E, an alert signal is provided when keys are pressed that causes SMC 300E to query LCD panels 104 for the keys that were pressed.

SMC 300E communicates with power supply units 114 via one or more of the SMB I²C buses 554B, 554D, and 554F to obtain configuration and status information including the operational state of the power supply units 114. In one embodiment, the dual redundant power supply units 114 provide voltage rail measurements to SMC 300E. A minimum and maximum voltage value is stored by the power supply units 114 for each measured rail. The voltage values are polled by SMC 300E at a time interval defined by the current configuration information for SMC 300E. If a voltage measurement goes out of specification, defined by maximum and minimum voltage configuration parameters, SMC 300E generates an alarm event. In one embodiment, power supply units 114 store configuration and status information in their associated EEPROMs 323 (shown in FIG. 3).

Backplane ID Bus (BP) 554G is coupled to backplane EEPROM 314 (shown in FIG. 3) on backplane 106. SMC 300E communicates with the backplane EEPROM 314 over the BP bus 554G to obtain backplane manufacturing data, including hardware identification and revision number. On start-up, SMC 300E communicates with EEPROM 314 to obtain the manufacturing data, which is then added to the hardware fitted table. The manufacturing data allows SMC 300E to determine if it is in the correct chassis for the configuration it has on board, since it is possible that the SMC 300E has been taken from a different chassis and either hot-swapped into a new chassis, or added to a new chassis and the chassis is then powered up. If there is no valid configuration on board, or SMC 300E cannot determine which chassis it is in, then SMC 300E waits for a pushed configuration from external management network 320, or for a manual user configuration via one of the connection methods discussed below.

In one embodiment, there is a single temperature sensor 324 within system 100. SMC 300E receives temperature information from temperature sensor 324 over I²C bus 554H. SMC 300E monitors and records this temperature and adjusts the speed of the cooling fans 304 accordingly, as described below. SMC also uses I²C bus 554H to access EEPROM 550, which stores board revision and manufacture data for SMC 300E.

F. Serial Ports

SMC 300E includes 4 RS-232 interfaces 310A-310D (collectively referred to as serial ports 310). RS-232 serial interface 310A is via a 9-pin Male D-type connector on the front panel of SMC 300E. The other three serial ports 310B-310D are routed through backplane 106. The front panel RS-232 serial interface 310A is connected via a UART with a full modem 534 to FPGA 508, to allow monitor and debug information to be made available via the front panel of SMC 300E. Backplane serial port 310D is also connected via a UART with a full modem 538 to FPGA 508. In one embodiment, backplane serial port 310D is intended as a debug or console port. The other two backplane serial interfaces 310B and 310C are connected via a dual UART 536 to FPGA 508, and are routed to managed Ethernet switches 300C and 300D through backplane 106. These two backplane serial interfaces 310B and 310C are used to connect to and configure the managed Ethernet switch cards 300C and 300D, and to obtain status information from the managed Ethernet switch cards 300C and 300D.

G. Fans and Temperature Control

In one embodiment, server system 100 includes six chassis fans 304. Server system 100 includes temperature sensor 324 to monitor the chassis temperature, and fan sensors 306 to monitor the six fans 304. In one embodiment, fan sensors 306 indicate whether a fan 304 is rotating and the fan's speed setting. In one form of the invention, FPGA 508 includes 6 fan input lines 522D (i.e., one fan input line 522D from each fan sensor 306) to monitor the rotation of the six fans 304, and a single fan output line 524 coupled to fan controllers 526A-526C. Fan controllers 526A-526C control the speed of fans 304 by a PWM (pulse width modulation) signal via output lines 528A-528F. If a fan 304 stalls, the monitor line 522D of that fan 304 indicates this condition to FPGA 508, and an alarm event is generated. The speed of fans 304 is varied to maintain an optimum operating temperature versus fan noise within system 100. If the chassis temperature sensed by temperature sensor 324 reaches or exceeds a temperature alarm threshold, an alarm event is generated. When the temperature reduces below the alarm threshold, the alarm event is cleared. If the temperature reaches or exceeds a temperature critical threshold, the physical integrity of the components within system 100 are considered to be at risk, and SMC 300E performs a system shut-down, and all cards 300 are powered down except SMC 300E. When the chassis temperature falls below the critical threshold and has reached the alarm threshold, SMC 300E restores the power to all of the cards 300 that were powered down when the critical threshold was reached.

In one embodiment, SMC 300E controls the power state of cards 300 using power reset (PRST) lines 514 and power off (PWR_OFF) lines 516. FPGA 508 is coupled to power reset lines 514 and power off lines 516 via output registers 510A and 510B, respectively. In one embodiment, power reset lines 514 and power off lines 516 each include 19 output lines that are coupled to cards 300. SMC 300E uses power off lines 516 to turn off the power to selected cards 300, and uses power reset lines 514 to reset selected cards 300. In one embodiment, a lesser number of power reset and power off lines are used for the 10 slot chassis configuration.

H. Clock Generator/Watchdog

SMC 300E is protected by both software and hardware watchdog timers. The watchdog timers are part of clock generator/watchdog block 540, which also provides a clock signal for SMC 300E. The hardware watchdog timer is started before software loading commences to protect against failure. In one embodiment, the time interval is set long enough to allow a worst-case load to complete. If the hardware watchdog timer expires, SMC processor 502 is reset.

I. Modes of Operation

In one embodiment, SMC 300E has three phases or modes of operation—Start-up, normal operation, and hot swap. The start-up mode is entered on power-up or reset, and controls the sequence needed to make SMC 300E operational. SMC 300E also provides minimal configuration information to allow chassis components to communicate on the management LAN. The progress of the start-up procedure can be followed on LEDs 322, which also indicate any errors during start-up.

The normal operation mode is entered after the start-up mode has completed. In the normal operation mode, SMC 300E monitors the health of system 100 and its components, and reports alarm events. SMC 300E monitors the chassis environment, including temperature, fans, input signals, and the operational state of the host processor cards 300A.

SMC 300E reports alarm events to a central point, namely an alarm event manager, via the management LAN (i.e., through LAN switch 532 and one of the two SMC rear transition modules 300F or 300G to external management network 320). The alarm event manager is an external module that is part of external management network 320, and that handles the alarm events generated by server system 100. The alarm event manager decides what to do with received alarms and events, and initiates any recovery or reconfiguration that may be needed. In addition to sending the alarm events across the management network, a system event log (SEL) is maintained in SMC 300E to keep a record of the alarms and events. The SEL is held in non-volatile flash memory 500 in SMC 300E and is maintained over power cycles, and resets of SMC 300E.

In the normal operation mode, SMC 300E may receive and initiate configuration commands and take action on received commands. The configuration commands allow the firmware of SMC processor 502 and the hardware controlled by processor 502 to be configured. This allows the operation of SMC 300E to be customized to the current environment. Configuration commands may originate from the management network 320, one of the local serial ports 310 via a test shell (discussed below), or one of the LCD panels 104.

The hot swap mode is entered when there is an attempt to remove a card 300 from system 100. In one embodiment, all of the chassis cards 300 can be hot swapped, including SMC 300E, and the two power supply units 114. An application shutdown sequence is initiated if a card 300 is to be removed. The shutdown sequence performs all of the steps needed to ready the card 300 for removal.

In one embodiment, FPGA 508 includes 18 hot swap status inputs 522B. These inputs 522B allow SMC 300E to determine the hot swap status of host processor cards 300A, hard disk cards 300B, managed Ethernet switch cards 300C and 300D, SMC rear transition module cards 300F and 300G, and power supply units 114. The hot-swap status of the SMC card 300E itself is also determined through this interface 522B.

An interrupt is generated and passed to SMC processor 502 if any of the cards 300 in system 100 are being removed or installed. SMC 300E monitors board select (BD_SEL) lines 518 and board healthy (HEALTHY) lines 520 of cards 300 in system 100. In one embodiment, board select lines 518 and healthy lines 520 each include 19 input lines, which are connected to FPGA 508 via input registers 512A and 512B, respectively. SMC 300E monitors the board select lines 518 to sense when a card 300 is installed. SMC 300E monitors the healthy lines 520 to determine whether cards 300 are healthy and capable of being brought out of a reset state.

When SMC 300E detects that a card has been inserted or removed, an alarm event is generated. When a new card 300 is inserted in system 100, SMC 300E determines the type of card 300 that was inserted by polling the identification EEPROM 302A of the card 300. Information is retrieved from the EEPROM 302A and added to the hardware fitted table. SMC 300E also configures the new card 300 if it has not been configured, or if its configuration differs from the expected configuration. When a card 300, other than the SMC 300E, is hot-swapped out of system 100, SMC 300E updates the hardware fitted table accordingly.

In one embodiment, SMC 300E is extracted in three stages: (1) an interrupt is generated and passed to the SMC processor 502 when the extraction lever 308 on the SMC front panel is set to the "extraction" position in accordance with the Compact PCI specification, indicating that SMC 300E is about to be removed; (2) SMC processor 502 warns the external management network 320 of the SMC 300E removal and makes the extraction safe; and (3) SMC processor 502 indicates that SMC may be removed via the blue hot/swap LED 322. SMC 300E ensures that any application download and flashing operations are complete before the hot swap LED 322 indicates that the card 300E may be removed.

J. User Connectivity

In one embodiment, there are two test shells implemented within SMC 300E. There is an application level test shell that is a normal, run-time, test shell accessed and used by users and applications. There is also a stand-alone test shell that is a manufacturer test shell residing in flash memory 500 that provides manufacturing level diagnostics and functions. The stand-alone test shell is activated when SMC 300E boots and an appropriate jumper is in place on SMC 300E. The stand-alone test shell allows access to commands that the user would not, or should not have access to.

The test shells provide an operator interface to SMC 300E. This allows an operator to query the status of system 100 and (with the required authority level) to change the configuration of system 100.

A user can interact with the test shells by a number of different methods, including locally via a terminal directly attached to one of the serial ports 310, locally via a terminal attached by a modem to one of the serial ports 310, locally via one of the two LCD panels 104, and remotely via a telnet session established through the management LAN 320. A user may connect to the test shells by connecting a terminal to either the front panel serial port 310A or rear panel serial ports 310B-310D of SMC 300E, depending on the console/modem serial port configuration. The RS-232 and LAN connections provide a telnet console interface. LCD panels 104 provide the same command features as the telnet console interface. SMC 300E can function as either a dial-in facility, where a user may establish a link by calling to the modem, or as a dial-out facility, where SMC 300E can dial out to a configured number.

The test shells provide direct access to alarm and event status information. In addition, the test shells provides the user with access to other information, including temperature logs, voltage logs, chassis card fitted table, and the current setting of all the configuration parameters. The configuration of SMC 300E may be changed via the test shells. Any change in configuration is communicated to the relevant cards 300 in system 100. In one embodiment, configuration information downloaded via a test shell includes a list of the cards 300 expected to be present in system 100, and configuration data for these cards 300. The configuration information is stored in flash memory 500, and is used every time SMC 300E is powered up.

K. Graceful Shutdown of Host Processor Cards

Figure 6:
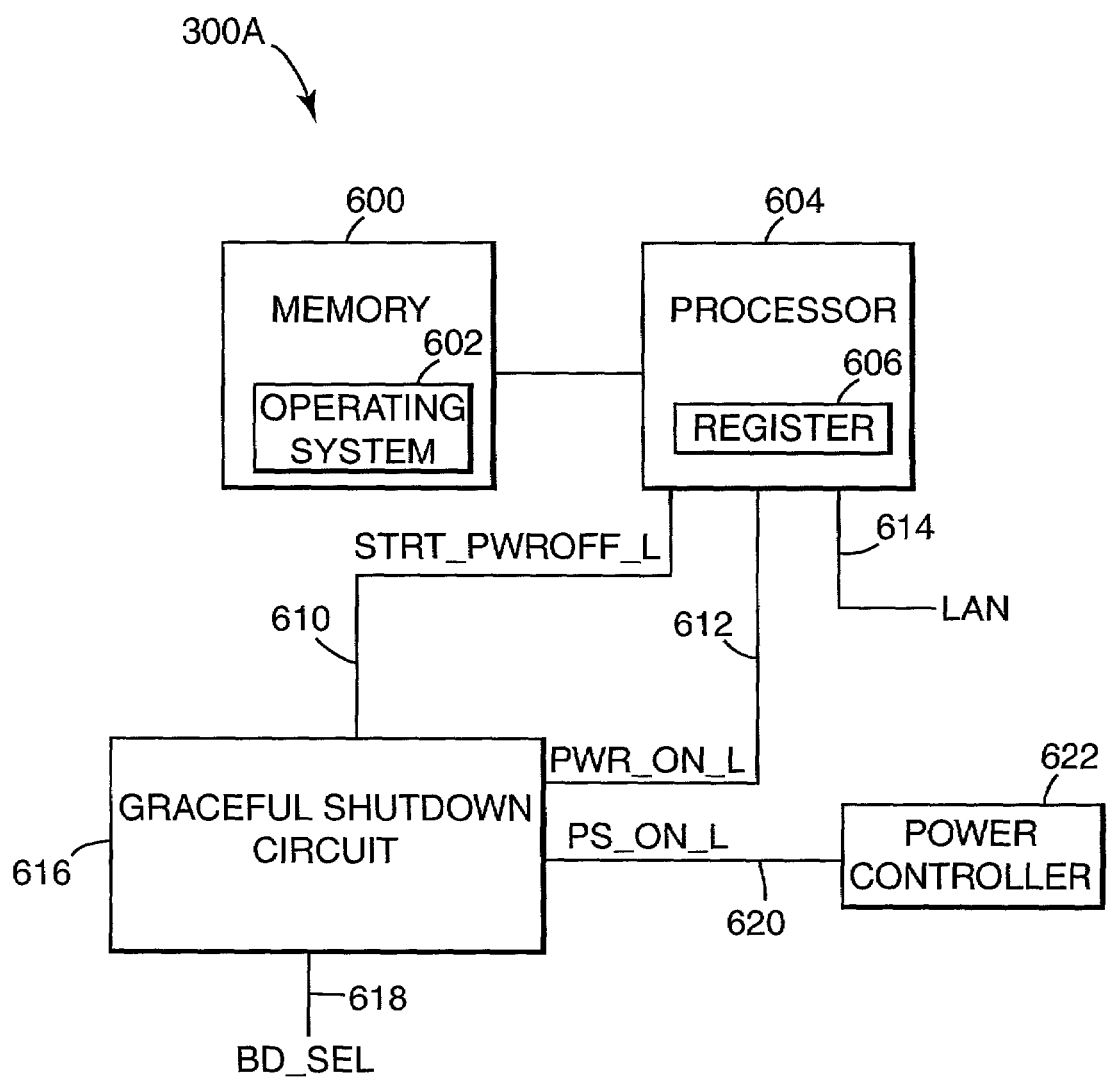
FIG. 6 is an electrical block diagram illustrating major components of an exemplary host processor card, which includes a graceful shutdown circuit according to one embodiment of the present invention.

FIG. 6 is an electrical block diagram illustrating major components of an exemplary host processor card 300A, which includes a graceful shutdown circuit 616 for a graceful shutdown of host processor card 300A according to one embodiment of the present invention. Host processor card 300A includes memory 600, processor 604, graceful shutdown circuit 616, and power controller 622. Memory 600 includes operating system 602. Processor 604 includes register 606, and input/output lines 610, 612, and 614. In one embodiment, line 610 is a "STRT_PWROFF_L" input line coupled to graceful shutdown circuit 616, line 612 is a "PWR_ON_L" output line coupled to graceful shutdown circuit 616, and line 614 is a LAN connection. In addition to being coupled to lines 610 and 612, graceful shutdown circuit 616 is also coupled to a "BD_SEL" line 618 and a "PS_ON_L" line 620. Power controller 622 is coupled to graceful shutdown circuit 616 via PS_ON_L line 620. Graceful shutdown circuit 616 provides a controlled mechanism by which host processor card 300A can participate in the standard cPCI hot swap protocol, and still allow for a graceful shutdown required for data integrity. Host processor card 300A is discussed in additional detail with reference to FIG. 7.

Figure 7:
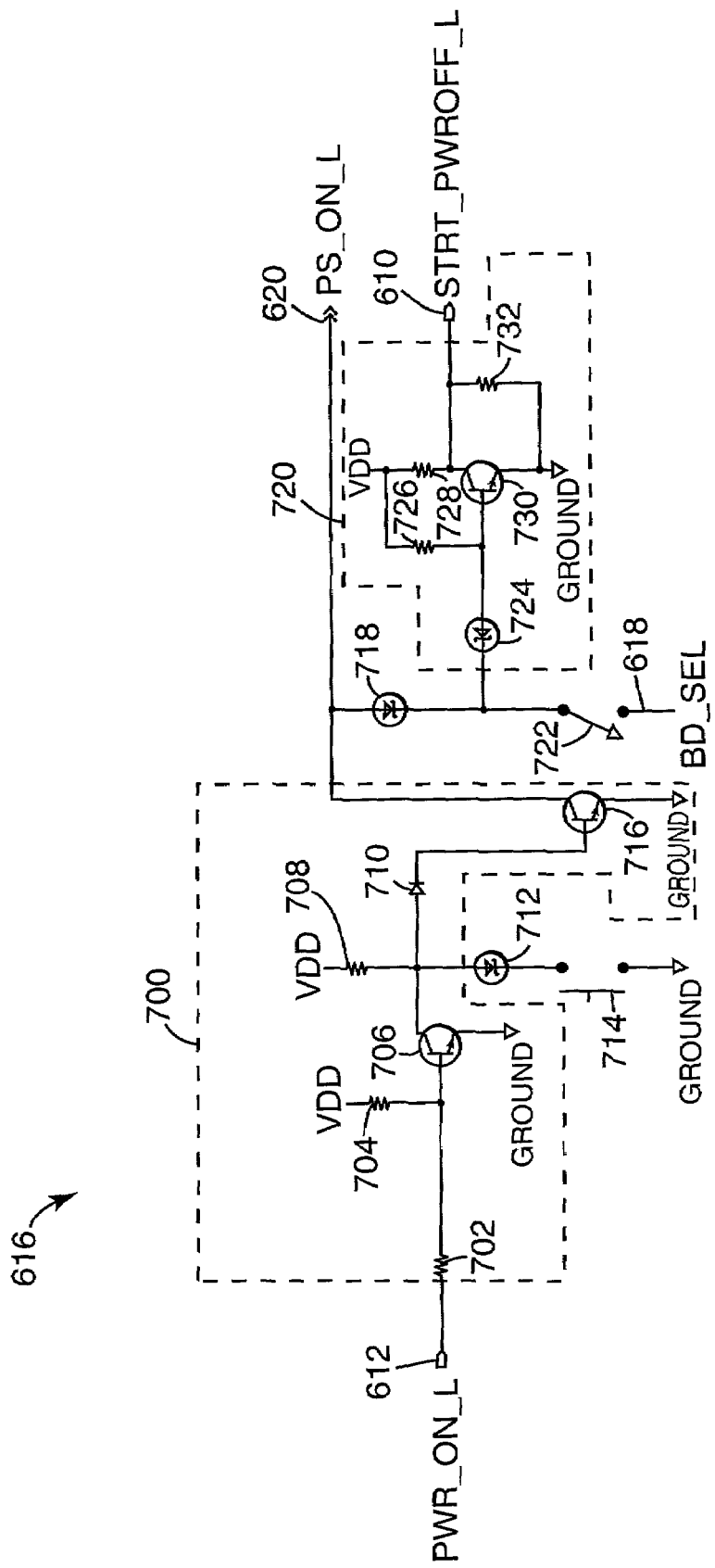
FIG. 7 is an electrical schematic diagram of a graceful shutdown circuit according to one embodiment of the present invention.

FIG. 7 is an electrical schematic diagram of graceful shutdown circuit 616. Graceful shutdown circuit 616 includes operating system (OS) switch circuit 700, schottky diode 712, emergency switch 714, schottky diode 718, extractor switch 722, and monitor circuit 720. OS switch circuit 700 includes resistors 702, 704, and 708, transistors 706 and 716, and diode 710. Resistor 702 is coupled to PWR_ON_L line 612, resistor 704, and the base of transistor 706. Resistor 704 is also coupled to a power supply. The emitter of transistor 706 is coupled to ground, and the collector of transistor 706 is coupled to resistor 708, diode 710, and schottky diode 712. Resistor 708 is also coupled to a power supply. Diode 710 is coupled to the base of transistor 716. The emitter of transistor 716 is coupled to ground. The collector of transistor 716 is coupled to PS_ON_L line 620 and schottky diode 718. Transistor 716 acts as a switch and is also referred to as switch 716.

Switch 716 is coupled in parallel to switch 722 via schottky diode 718. Switch 722 is also coupled to BD_SEL line 618. An extraction lever 308 (shown in FIG. 3) for host processor card 300A controls switch 722. Switch 716 is controlled by register 606 under control of operating system 602, which causes processor 604 to set PWR_ON_L line 612 either high or low, thereby closing or opening switch 716. When switch 722 is closed, a power control signal is delivered from SMC 300E to power controller 622 of host processor card 300A, which enables the power controller 622 to energize or de-energize card 300A. More particularly, the power control signal originates from the SMC PWR_OFF output line 516 (shown in FIG. 5), which is coupled to BD_SEL line 618 of host processor card 300A. The power control signal is provided to power controller 622 via PS_ON_L line 620. When switch 716 is closed, operating system 602 can override SMC 300E and keep host processor card 300A energized via PS_ON_L line 620. When both switches 716 and 722 are open, host processor card 300A can be prevented from being energized.

In normal operation, when host processor card 300A is in place in a slot 110, switch 722 is closed, allowing host processor card 300A to energize. While booting up, PWR_ON_L line 612 is held high, which keeps switch 716 open. When operating system 602 has booted to the point where it cannot tolerate an immediate shutdown, operating system 602 writes a value to register 606 to indicate this status. The operating system 602 is then able to keep host processor card 300A energized independent of SMC 300E. When processor 604 sees the value in register 606 indicating that it is to keep host processor card 300A energized, processor 604 sets PWR_ON_L line 612 low. Setting PWR_ON_L line 612 low causes switch 716 to close, thereby allowing host processor card 300A to remain energized via PS_ON_L line 620.

Monitor circuit 720 is coupled to switch 722 via schottky diode 724. Schottky diode 724 is coupled to resistor 726 and the base of transistor 730. The emitter of transistor 730 is coupled to STRT_PWROFF_L line 610 through resistor 732, and is coupled to ground. The collector of transistor 730 is coupled to resistor 728. Resistors 726 and 728 are also connected to a power supply. Monitor circuit 720 monitors switch 722, and is configured to generate a high priority interrupt via STRT_PWROFF_L line 610 to operating system 602 when either the switch 722 is opened, or SMC 300E attempts to de-energize the host processor card 300A. If switch 722 is opened indicating pending removal of host processor card 300A, or if SMC 300E drives BD_SEL line 618 high, monitor circuit 720 drives STRT_PWROFF_L line 610 low, indicating that a power down is requested. If operating system 602 has not enabled "soft power" by driving PWR_ON_L line 612 low causing switch 716 to close, then opening switch 722 or setting BD_SEL line 618 high causes an immediate power shutdown of host processor card 300A. If operating system 602 has enabled soft power by driving PWR_ON_L line 612 low causing switch 716 to close, then opening switch 722 or setting BD_SEL line 618 high will cause operating system 602 to perform an immediate graceful shutdown. As a last action as part of the graceful shutdown, operating system 602 clears register 606, causing processor 604 to set PWR_ON_L 612 high and open switch 716, thereby allowing power controller 622 to de-energize the host processor card 300A. Also, if operating system 602 is manually shutdown, a last action performed by operating system 602 is to open switch 716, thereby allowing switch 722 and SMC 300E to again be in sole control of energizing and de-energizing host processor card 300A.

Graceful shutdown circuit 616 also includes an emergency override switch 714. Emergency override switch 714 is coupled to OS switch circuit 700 via schottky diode 712, and is also coupled to ground. Because operating system 602 is in sole control of switch 716, once the operating system 602 has closed switch 716, operating system 602 must remain operational in order to open switch 716. If there is an unrecoverable operating system failure, then the interrupt generated by the actuation of switch 722 will go unprocessed and host processor card 300A will not be able to turn off. By including an emergency override switch 714 that overrides switch 716, host processor card 300A can be immediately powered off even if operating system 602 fails.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A host processor card configured to be fitted into a server system, the host processor card comprising:
   a processor;
   a memory coupled to the processor for storing an operating system;
   a power control line for controlling the power state of the host processor card;
   a graceful shutdown circuit coupled to the processor and the power control line, the processor configured to automatically provide a graceful shutdown signal to the graceful shutdown circuit based on a boot-up state of the operating system, the graceful shutdown circuit configured to allow a graceful shutdown of the host processor card when the power control line indicates that the host processor card is to be powered down if the processor has provided the graceful shutdown signal; and
   wherein the graceful shutdown circuit is configured to allow an immediate shutdown of the host processor card when a received power control signal indicates that the host processor card is to be powered down if the processor has not provided the graceful shutdown signal,
   wherein the graceful shutdown circuit further comprises a monitor circuit coupled to the power control line and coupled to the processor, the monitor circuit configured to provide an indication of the status of the power control line to the processor, and
   a switch circuit coupled to the power control line and coupled to the processor, the switch circuit configured to override a power down signal on the power control line and thereby maintain power to the host processor card if the processor has provided the graceful shutdown signal to the graceful shutdown circuit.

2. The host processor card of claim 1, wherein the power control line is coupled to a switch that is configured to close when the host processor card is inserted into the server system, causing the power control line to indicate tat the host processor card is to be powered up.

3. The host processor card of claim 2, wherein the switch is configured to open when the host processor card is being removed from the server system, causing the power control line to indicate that the host processor card is to be powered down.

4. The host processor card of claim 2 or claim 3, wherein the power control line is coupled to a server management card that is configured to control the power state of the host processor card via the power control line when the switch is closed.

5. The host processor card of claim 1, wherein the processor includes a register for indicating when a graceful shutdown is to be performed, and wherein the operating system is configured to write a value to the register indicating whether a graceful shutdown is to be performed.

6. The host processor card of claim 5, wherein the operating system is configured to write a value to the register indicating that a graceful shutdown is to be performed when the operating system boots up to a point that an immediate shutdown should not be performed.

7. The host processor card of claim 1, wherein the graceful shutdown circuit further comprises a manual emergency switched coupled to the switch circuit, the emergency switch configured to cause immediate shutdown of the host processor card.

8. A graceful shutdown circuit for a host processor card configured to be fitted into a server system, the graceful shutdown circuit comprising:
   a power control line for controlling the power state of the host processor card via a server management card of the server system;
   a monitor circuit for monitoring the state of the power control line, the monitor circuit including a first output configured to be coupled to a processor of the host processor card to indicate the state of the power control line;
   a first input configured to be coupled to a processor of the host processor card, the first input indicating whether a graceful shutdown is to be performed;
   a switch circuit coupled to the first input and the power control line, the switch circuit configured to override a power down signal from the server management card on the power control line and thereby maintain power to the host processor card via the power control line when the first input indicates that a graceful shutdown is to be performed; and
   wherein the switch circuit is configured to allow an immediate shutdown of the host processor card when the first input indicates that a graceful shutdown is not to be performed.

9. The graceful shutdown circuit of claim 8, wherein the graceful shutdown circuit further comprises a manual emergency switch coupled to the switch circuit, the emergency switch configured to cause immediate shutdown of the host processor card.

10. A method of gracefully shutting down a host processor card in a server system, the method comprising:
   monitoring a power control line that controls the power state of the host processor card;
   providing a graceful shutdown indication from an operating system of the host processor card to a processor of the host processor card when the operating system boots up to a point that an immediate shutdown of the host processor card should not be performed;
   outputting a graceful shutdown signal from the processor when an immediate shutdown of the host processor card should not be performed;

overriding the power control line when the processor outputs the graceful shutdown signal, thereby maintaining power to the host processor card;

initiating a graceful shutdown of the operating system when the power control line provides a power down signal if the operating system has provided the graceful shutdown indication to the processor; and allowing an immediate shutdown of the host processor card when the power control line provides a power down signal if the operating system has not provided the graceful shutdown indication to the processor.

11. The method of claim 10, wherein the power control line is coupled to a switch that is configured to close when the host processor card is inserted into the server system, causing the power control line to indicate that the host processor card is to be powered up.

12. The method of claim 11, wherein the switch is configured to open when the host processor card is being removed from the server system, causing the power control line to indicate that the host processor card is to be powered down.

13. The method of claim 11 or claim 12, wherein the power control line is coupled to a server management card that is configured to control the power state of the host processor card via the power control line when the switch is closed.

14. The method of claim 10 wherein the graceful shutdown indication is provided by the operating system by writing a value to a register of the processor.

15. The method of claim 10 and further comprising: providing a manual emergency switch for causing an immediate shutdown of the host processor card.

* * * * *

UNITED STATES PATENT AND TRADEMARK OFFICE
CERTIFICATE OF CORRECTION

PATENT NO. : 7,263,620 B2 Page 1 of 1
APPLICATION NO. : 09/923976
DATED : August 28, 2007
INVENTOR(S) : Kirk Bresniker et al.

It is certified that error appears in the above-identified patent and that said Letters Patent is hereby corrected as shown below:

In column 13, line 64, in Claim 2, after "indicate" delete "tat" and insert -- that --, therefor.

In column 16, line 10, in Claim 14, after "claim 10" insert -- , --.

In column 16, line 14, in Claim 15, after "claim 10" insert -- , --.

Signed and Sealed this

Fifteenth Day of September, 2009

David J. Kappos
*Director of the United States Patent and Trademark Office*